(12) United States Patent
Huang

(10) Patent No.: US 7,333,344 B2
(45) Date of Patent: Feb. 19, 2008

(54) FLEXIBLE PRINTED CIRCUIT BOARD

(75) Inventor: Chin-Mei Huang, Taichung (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 11/358,057

(22) Filed: Feb. 22, 2006

(65) Prior Publication Data
US 2007/0015378 A1    Jan. 18, 2007

(30) Foreign Application Priority Data
Jul. 13, 2005    (TW) .............................. 94211919 U

(51) Int. Cl.
*H05K 1/00*    (2006.01)
(52) U.S. Cl. ..................... 361/749; 174/250
(58) Field of Classification Search ................ 361/749, 361/751, 739, 757, 771; 174/256, 250; 439/67
See application file for complete search history.

(56) References Cited

U.S. PATENT DOCUMENTS

| | | | | |
|---|---|---|---|---|
| 3,805,213 A | * | 4/1974 | Austin | ........................ 439/77 |
| 4,293,987 A | * | 10/1981 | Gottbreht et al. | .......... 29/25.42 |
| 4,587,719 A | * | 5/1986 | Barth | .......................... 438/113 |
| 6,319,019 B1 | * | 11/2001 | Kwon et al. | .................. 439/67 |
| 6,373,709 B1 | * | 4/2002 | Hino et al. | ................. 361/749 |
| 6,559,524 B2 | * | 5/2003 | Seko | .......................... 257/673 |

* cited by examiner

*Primary Examiner*—Dean Reichard
*Assistant Examiner*—Sheldon Soon
(74) *Attorney, Agent, or Firm*—Bacon & Thomas PLLC

(57) ABSTRACT

A flexible printed circuit board includes a flexible substrate, which has a bonding zone, a folding zone, and a folding line between the bonding zone and the folding zone, two electrically conductive contacts respectively located at the bonding zone, two lead wires each having an extension portion respectively electrically connected to the electrically conductive contacts and arranged in parallel to the folding line and a connecting portion extending integrally from the extension portion toward the folding zone, and a protective layer covered on the flexible substrate over the lead wires. The protective layer has openings corresponding to the electrically conductive contacts.

2 Claims, 5 Drawing Sheets

FLEXIBLE PRINTED CIRCUIT BOARD

BACKGROUND OF THE INVENTION

1. Field of the Invention

The present invention relates a printed circuit board (hereinafter referred as PCB) and more particularly, to a flexible printed circuit board (hereinafter referred as FPC), which can prevent breaking of the circuit by changing the trace of the lead wires.

2. Description of the Related Art

FIGS. 1 and 2 show a conventional FPC. According to this design, the FPC comprises a flexible substrate 1, a plurality of lead wires 2 that are arranged on the surface of the flexible substrate 1 and have respectively one end terminating in a contact 2a, a protective layer 3 that is formed on the surface of the substrate 1 and covered over the lead wires 2 and has two openings 3a for exposing respectively a pair of contacts 2a having bipolar polarity, and solder pads 4 respectively formed on the contacts 2a for the bonding of an electronic device 5.

As shown in FIG. 1, the lead wires 2 extend orthogonally across a folding line L1 of the flexible substrate and electrically connected to the electronic device 5 through the solder pads 4. Because the flexible substrate 1 and the solder pads 4 are made of different materials having different hardness, i.e. the hardness of the former is less than that of the latter, when bending the FPC along the folding line L1, a stress may be concentrated on the bonding area between the lead wires 2 and the solder pads 4, thereby causing the solder pads 4 or the lead wires 2 to break.

FIG. 3 shows another structure of FPC according to the prior art. According to this design, the FPC comprises a flexible substrate 6, two lead wires 7, and a light-transmittable protective layer 8. The flexible substrate 6 has a bonding zone 6a and a folding zone 6b. The lead wires 7 each have a plated through hole 7a disposed at one end within the bonding zone 6a. The other end of each lead wire 7 extends to the folding zone 6b. The protective layer 8 is covered on the surface of the flexible substrate 6, having an opening 8a corresponding to the plated through hole 7a of each lead wire 7. After bonding of the bonding zone 6a with another electronic device, for example, a PCB 9a, a part of the cured solder material 9b is formed on the flexible substrate 6 corresponding to the opening 8a. Because it is difficult to accurately perform the soldering operation, the soldered electronic device may be biased from the designed solder position. In order to prevent a bad result due to inaccurate bonding operation, each opening 8a is made relatively greater for tolerance. However, in actual bonding operation, a part of each lead wire 7 may lay open to the outside. When the folding zone 6b of the flexible substrate 6 is turned back along a folding line L2 relative to the bonding zone 6a, a stress may be concentrated on the exposed part of each lead wire 7 to cause the break of the exposed part of each lead wire 7 so as to further cause malfunction of the PBC due to the open circuit of the lead wires 7.

Therefore, it is desirable to provide a FPC that eliminates the aforesaid drawbacks.

SUMMARY OF THE INVENTION

The present invention has been accomplished under the circumstances in view. It is therefore the main object of the present invention to provide a FPC, which has an extension portion provided between each lead wire and the respective solder pad and extending in parallel to the folding line of the flexible substrate to prevent solder tin cracking and breaking of lead wires.

To achieve this object of the present invention, the FPC comprises a flexible substrate, which has a bonding zone and a folding zone on a surface thereof and a folding line between the bonding zone and the folding zone, at least one electrically conductive contact respectively located at the bonding zone, and at least one lead wire. The lead wire has an extension portion electrically connected to the electrically conductive contact and arranged in parallel to the folding line, and a connecting portion extending integrally from the extension portion toward the folding zone.

DETAILED DESCRIPTION OF THE INVENTION

Figure 1:
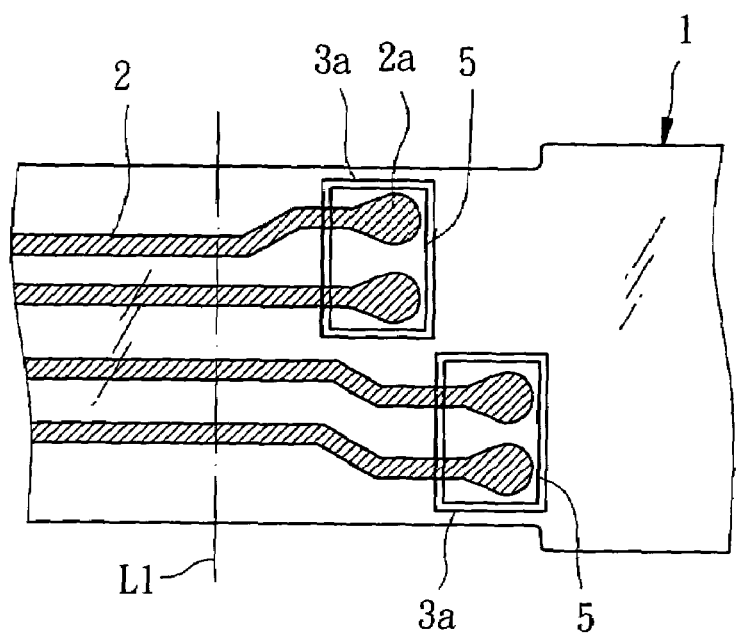
FIG. 1 is a top view of a part of a FPC according to the prior art.
Figure 2:
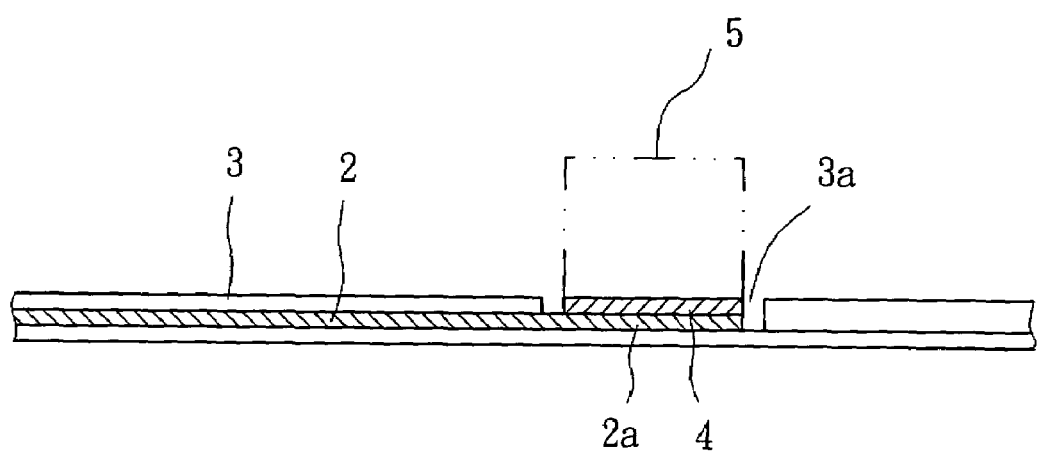
FIG. 2 is a sectional view of the prior art FPC shown in FIG. 1.
Figure 3:
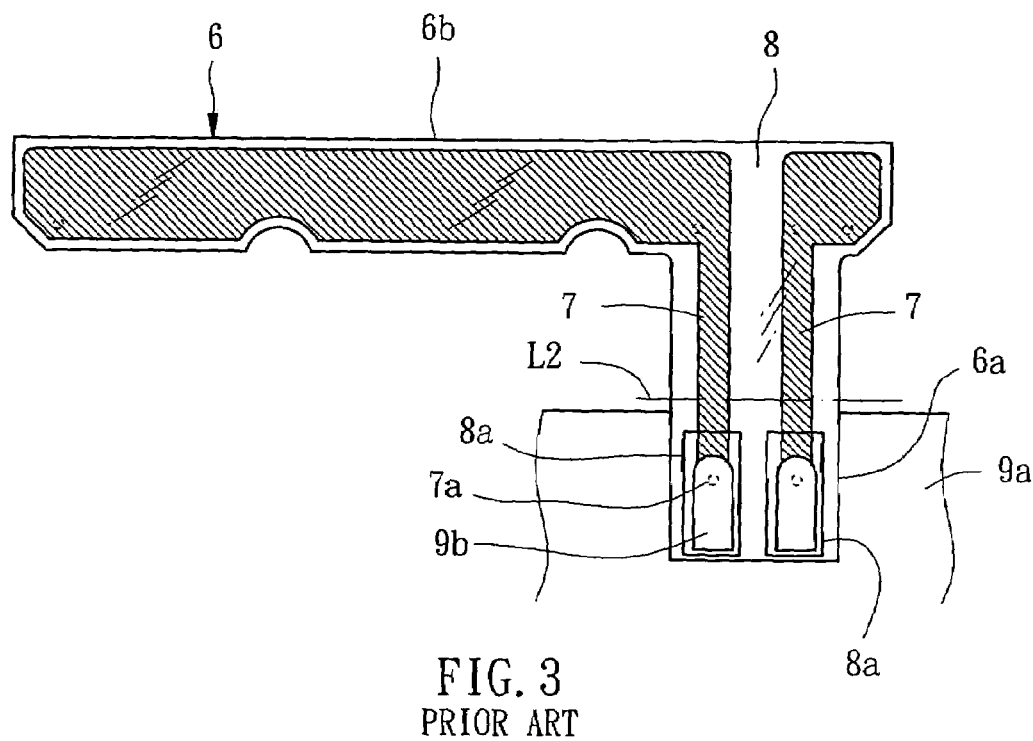
FIG. 3 is a top view of a part of another FPC according to the prior art.
Figure 4:
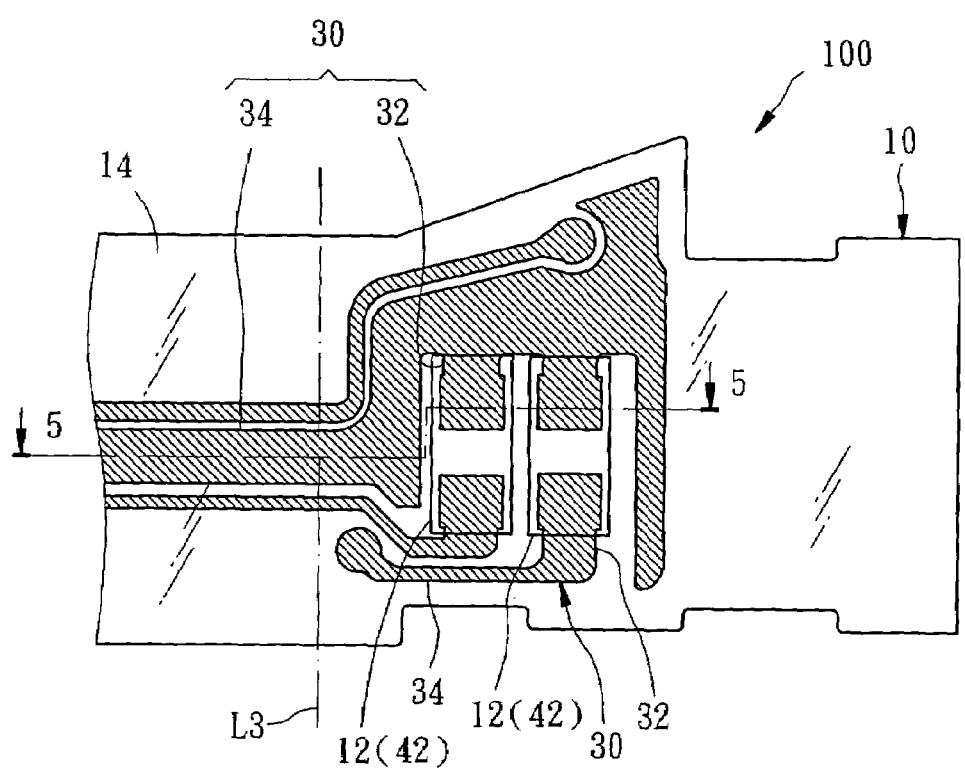
FIG. 4 is a top view of a part of a FPC according to a first preferred embodiment of the present invention.
Figure 5:
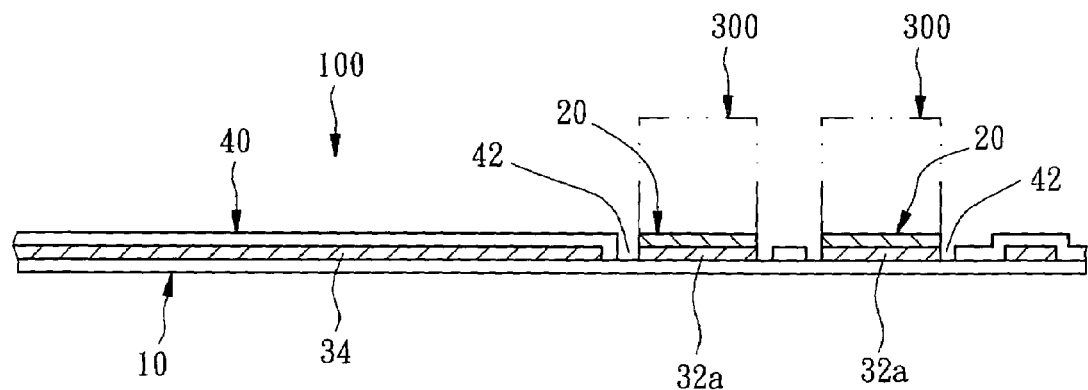
FIG. 5 is a sectional view taken along the line 5-5 of FIG. 4.

Referring to FIGS. 4 and 5, a FPC 100 in accordance with the first preferred embodiment of the present invention is shown comprising a flexible substrate 10, a plurality of electrically conductive contacts 20, a plurality of metal lead wires 30, and an insulative protective layer 40.

The flexible substrate 10 has two bonding zones 12, a folding zone 14, and a folding line L3 formed between the bonding zones 12 and the folding zone 14. The two bonding zones 12, as indicated by the imaginary lines in FIG. 4, are arranged in parallel to the folding line L3 for the bonding of a respective electronic device 300 (see FIG. 5). Upon installation of the FPC 100, the folding zone 14 can be turned back along the folding line L3 relative to the bonding zone 12.

The electrically conductive contacts 20 provided in this embodiment are solder pads respectively installed in the bonding zones 12 of the flexible substrate 10 before bonding of the electronic devices 300, and respectively electrically connected to the pre-made lead wires 30.

The lead wires 30 are formed on the surface of the flexible substrate 10, each having an extension portion 32 and a connecting portion 34. Each extension portion 32 has one end extending to the bonding zone 12 and terminating in a bonding point 32a on which an electrically conductive contact 20 is bonded. The extension portions 32 of the lead wires 30 are arranged in parallel to the folding line L3. The connecting portion 34 extends from the respective extension portion 32 toward the folding zone 14 for the connection of other electronic component parts (not shown) electrically.

The insulative protective layer 40 is covered on the surface of the flexible substrate 10 over the lead wires 30, having two openings 42 corresponding to the bonding zones 12. The openings 42 are so shaped that the electrically conductive contacts 20 can conveniently be installed in the bonding zones 12.

The above statement describes the structure of the FPC 100. According to this embodiment, the extension portions 32 of the lead wires 30 close to the bonding zones 12 are arranged in parallel to the folding line L3. This lead wire tracing design prevents the cracking of the soldering connection between the lead wires 30 and the electronic devices 300, which may be directly caused by the stretching of the lead wires 30 when turning back the folding zone 14 relative to the bonding zone 12 of the FPC 100, and therefore the FPC 100 maintains good conductivity.

Figure 6:
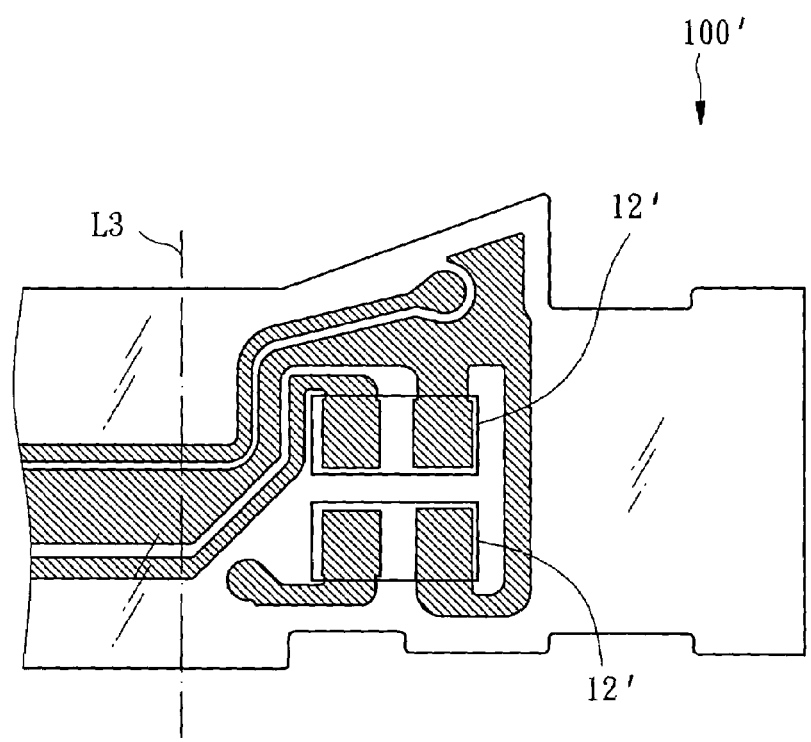
FIG. 6 is a top view of a part of a FPC according to a second preferred embodiment of the present invention.

FIG. 6 shows an alternate form of the present invention. The FPC 100' according to this second preferred embodiment is substantially similar to the aforesaid first preferred embodiment with the exception that the bonding zones 12' extend perpendicular to the folding line L3.

Figure 7:
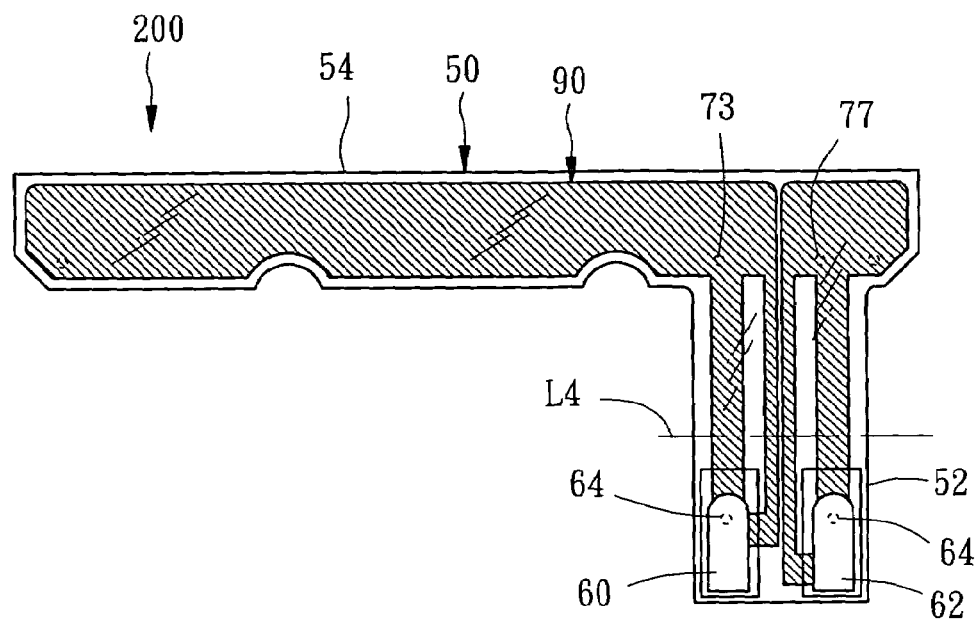
FIG. 7 is top view of a FPC according to a third preferred embodiment of the present invention.
Figure 8:
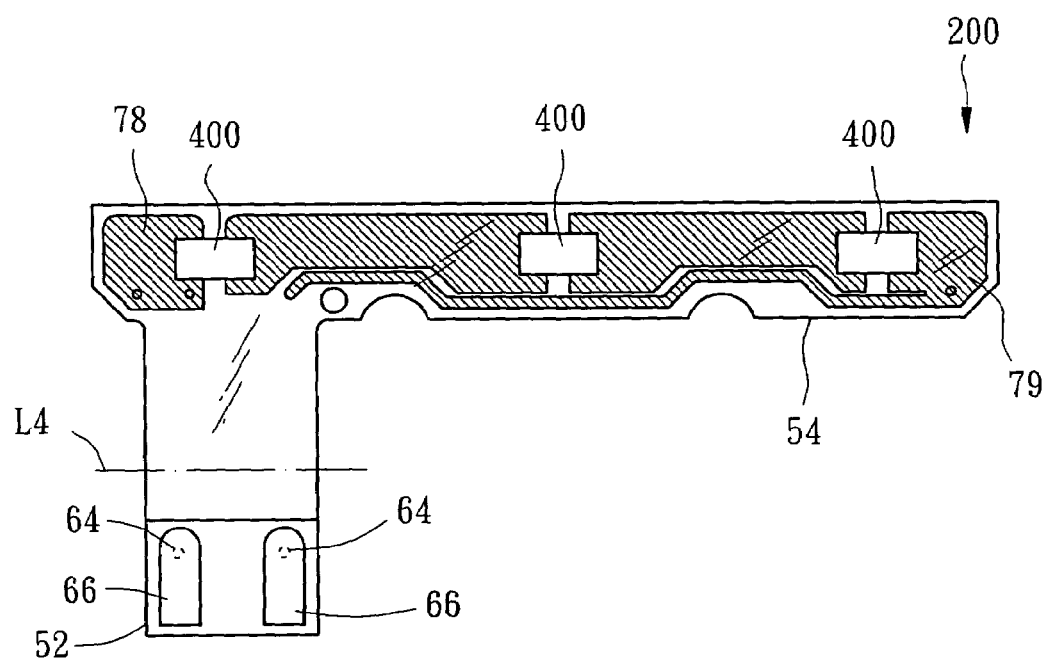
FIG. 8 is a bottom view of the FPC according to the third preferred embodiment of the present invention.
Figure 9:
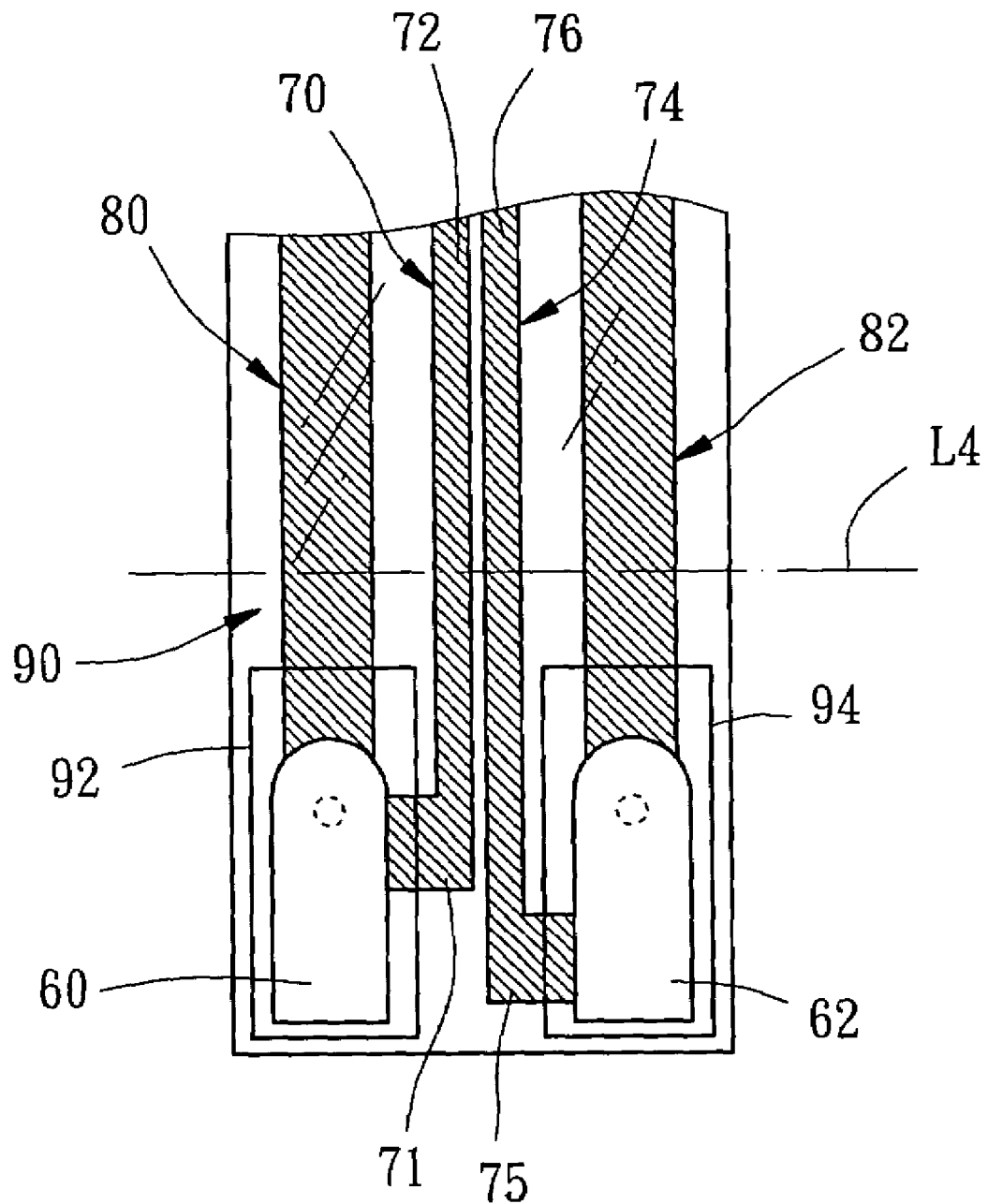
FIG. 9 is an enlarged view of a part of FIG. 7.

FIGS. 7-9 show another alternate form of the present invention. According to this third preferred embodiment, the FPC 200 comprises a flexible substrate 50, a first electrically conductive contact 60, a second electrically conductive contact 62, a first lead wire 70, a second lead wire 74, a first supplementary lead wire 80, a second supplementary lead wire 82, and an insulative protective layer 90.

The flexible substrate 50 comprises a bonding zone 52, a folding zone 54, and a folding line L4 formed between the bonding zone 52 and the folding zone 54.

The first electrically conductive contact 60 and the second electrically conductive contact 62 are installed in the bonding zone 52 and respectively electrically connected to a respective bonding contact 66 at the bottom wall of the flexible substrate 50 through a respective plated through hole 64. The bonding contacts 66 of the flexible substrate 50 are for the connection of an object, for example a PCB.

The first lead wire 70 has an extension portion 71 and a connecting portion 72. The extension portion 71 is electrically connected to the first electrically conductive contact 60, and arranged in parallel to the folding line L4. The connecting portion 72 extends from the extension portion 71 toward the folding zone 54. The second lead wire 74 has an extension portion 75 and a connecting portion 76. The extension portion 75 is electrically connected to the second electrically conductive contact 62, and arranged in parallel to the folding line L4. The connecting portion 76 extends from the extension portion 75 toward the folding zone 54. Further, the connecting portion 72 of the first lead wire 70 and the connecting portion 76 of the second lead wire 74 are respectively electrically connected to a first electrode 78 and a second electrode 79 at the bottom side of the flexible substrate 50 through plated through holes 73 and 77. The electrodes 78, 79 are for the connection of electronic devices, for example, LEDs (light emitting diodes) 400.

The first supplementary lead wire 80 is provided at the top surface of the flexible substrate 50 and electrically connected to the first electrically conductive contact 60 and the connecting portion 72 of the first lead wire 70. The second supplementary lead wire 82 is provided at the top surface of the flexible substrate 50, and electrically connected to the second electrically conductive contact 62 and the connecting portion 76 of the second lead wire 74.

The insulative protective layer 90 is covered on the flexible substrate 50 over the first lead wire 70 and the second lead wire 74, having a first opening 92 and a second opening 94. Through the first opening 92, the first electrically conductive contact 60 exposes to the outside. Through the second opening 94, the second electrically conductive contact 62 exposes to the outside. The size of each opening is slightly greater than the respective electrically conductive contact.

As shown in FIG. 9, the protective layer 90 covers a part of the extension portion 71 of the first lead wire 70 and a part of the extension portion 75 of the second lead wire 74. When turning back the folding zone 54 of the flexible substrate 50 relative to the bonding zone 52, the lead wires 70, 74 and the supplementary lead wires 80, 82 are stretched. Because the extension portions 71, 75 of the lead wires 70, 74 are partially protected under the protective layer 90 and because the extension portions 71, 75 are arranged in parallel to the folding line L4, the conductivity of the FPC is still maintained even if the exposed part of each supplementary lead wire 80, 82 is broken at this time due to concentration of stress.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A flexible printed circuit board comprising:
a flexible substrate having a bonding zone and a folding zone on a surface thereof and a folding line between said bonding zone and said folding zone;
at least one electrically conductive contact located at said bonding zone;
at least one lead wire having an extension portion and a connecting portion, said extension portion being connected to said electrically conductive contact and arranged in parallel to said folding line, said connecting portion extending integrally from said extension portion toward said folding zone; and
at least one supplementary lead wire located on the side of the flexible substrate where said at least one lead wire is located and electrically connected between said at least one electrically conductive contact and the connecting portion of said at least one lead wire.

2. The flexible printed circuit board as claimed in claim 1, wherein said at least one supplementary lead wire extends perpendicular to said folding line.

* * * * *